US012812939B2

(12) United States Patent
Tawara et al.

(10) Patent No.: US 12,812,939 B2
(45) Date of Patent: Nov. 24, 2026

(54) SILICON CARBIDE SEMICONDUCTOR DEVICE

(71) Applicants: FUJI ELECTRIC CO., LTD., Kawasaki (JP); NATIONAL INSTITUTE OF ADVANCED INDUSTRIAL SCIENCE AND TECHNOLOGY, Tokyo (JP)

(72) Inventors: Takeshi Tawara, Tsukuba-city (JP); Shinsuke Harada, Tsukuba-city (JP)

(73) Assignees: FUJI ELECTRIC CO., LTD, Kawasaki (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 945 days.

(21) Appl. No.: 18/071,599

(22) Filed: Nov. 29, 2022

(65) Prior Publication Data

US 2023/0100453 A1 Mar. 30, 2023

Related U.S. Application Data

(63) Continuation of application No. PCT/JP2021/027599, filed on Jul. 26, 2021.

(30) Foreign Application Priority Data

Jul. 29, 2020 (JP) ................................ 2020-128707

(51) Int. Cl.
*H10D 62/17* (2025.01)
*H10D 8/60* (2025.01)
(Continued)

(52) U.S. Cl.
CPC ............ *H10D 62/393* (2025.01); *H10D 8/60* (2025.01); *H10D 30/66* (2025.01);
(Continued)

(58) Field of Classification Search
CPC ............ H10D 62/8325; H10D 30/668; H10D 62/393; H10D 12/031; H10D 62/157;
(Continued)

(56) References Cited

U.S. PATENT DOCUMENTS

2007/0145479 A1 6/2007 Yamauchi et al.
2012/0112275 A1 5/2012 Steinmann et al.
(Continued)

FOREIGN PATENT DOCUMENTS

JP 2007180116 A 7/2007
JP 2014187114 A 10/2014
(Continued)

OTHER PUBLICATIONS

Hisaomi Iwata et al., "Donor and acceptor concentration dependence of the electron Hall mobility and the Hall scattering factor in n-type 4H- and 6H-SiC", Journal of Applied Physics, USA, American Institute of Physics, 2001, vol. 89, No. 11, Jun. 1, 2001, pp. 6228-6234.

(Continued)

*Primary Examiner* — Jessica S Manno
*Assistant Examiner* — Victor Joseph Lasasso
(74) *Attorney, Agent, or Firm* — Rabin & Berdo, P.C.

(57) ABSTRACT

An n$^-$-type drift layer is an n$^-$-type epitaxial layer doped with nitrogen as an n-type dopant and is co-doped with aluminum as a p-type dopant, the n$^-$-type drift layer containing the nitrogen and aluminum substantially uniformly throughout. An n-type impurity concentration of the n$^-$-type drift layer is an impurity concentration determined by subtracting the aluminum concentration from the nitrogen concentration of the n$^-$-type drift layer; a predetermined blocking voltage is realized by the impurity concentration. A combined impurity concentration of the nitrogen and aluminum of the n$^-$-type drift layer is at least $3\times10^{16}/cm^3$.

8 Claims, 6 Drawing Sheets

(51) Int. Cl.

| | |
|---|---|
| ***H10D 30/66*** | (2025.01) |
| ***H10D 62/832*** | (2025.01) |
| ***H10D 62/834*** | (2025.01) |
| ***H10P 14/20*** | (2026.01) |
| ***H10P 14/24*** | (2026.01) |

(52) U.S. Cl.
CPC ....... *H10D 30/668* (2025.01); *H10D 62/8325* (2025.01); *H10D 62/834* (2025.01); *H10P 14/20* (2026.01); *H10P 14/24* (2026.01); *H10P 14/2904* (2026.01); *H10P 14/3408* (2026.01); *H10P 14/3442* (2026.01)

(58) Field of Classification Search
CPC ............... H10D 12/481; H10D 64/117; H10D 64/01366; H10D 8/411; H10P 30/2042; H10P 30/21; H10P 14/3408; H10P 30/204
See application file for complete search history.

(56) References Cited

U.S. PATENT DOCUMENTS

| | | | | |
|---|---|---|---|---|
| 2014/0284620 | A1 | 9/2014 | Ota et al. | |
| 2014/0284623 | A1 | 9/2014 | Ota et al. | |
| 2019/0103462 | A1 | 4/2019 | Matsunaga | |
| 2019/0198621 | A1 * | 6/2019 | Lutz ..................... | H10D 62/129 |
| 2021/0020740 | A1 * | 1/2021 | Siemieniec .......... | H10D 12/031 |

FOREIGN PATENT DOCUMENTS

| | | | |
|---|---|---|---|
| JP | 2014187115 | A | 10/2014 |
| JP | 2019067982 | A | 4/2019 |
| WO | 2017169777 | A1 | 10/2017 |

OTHER PUBLICATIONS

International Search Report for PCT/JP2021/027599, mailed on Sep. 28, 2021.
Written Opinion of the International Searching Authority for PCT/JP2021/027599, mailed on Sep. 28, 2021.

* cited by examiner

SILICON CARBIDE SEMICONDUCTOR DEVICE

CROSS REFERENCE TO RELATED APPLICATIONS

This is a continuation application of International Application PCT/JP2021/027599 filed on Jul. 26, 2021 which claims priority from a Japanese Patent Application No. 2020-128707 filed on Jul. 29, 2020, the contents of which are incorporated herein by reference.

BACKGROUND OF THE INVENTION

1. Field of the Invention

Embodiments of the invention relate to a silicon carbide semiconductor device.

2. Description of the Related Art

Conventionally, in a metal oxide semiconductor field effect transistor (MOSFET) that contains silicon carbide (SiC) as a semiconductor material, has a blocking voltage of about 1.2 kV to 6.5 kV, and has an insulated gate with a 3-layer structure including a metal, an oxide film, and a semiconductor, a semiconductor substrate is used in which an epitaxial layer having a short minority carrier lifetime is deposited, as an $n^+$-type buffer layer, on an $n^+$-type starting substrate that constitutes an $n^+$-type drain region.

A structure of a conventional silicon carbide semiconductor device is described. FIG. 8 is a cross-sectional view depicting the structure of the conventional silicon carbide semiconductor device. A conventional silicon carbide semiconductor device 110 depicted in FIG. 8 has a vertical MOSFET with a general trench gate structure in a semiconductor substrate 130 in which 4-layer periodic hexagonal crystal silicon carbide (4H—SiC) is used as a semiconductor material. The semiconductor substrate 130 is formed by sequentially stacking epitaxial layers 132, 133, 134 on an $n^+$-type starting substrate 131 ($n^+$-type drain region 101), the epitaxial layers 132, 133, 134 constituting an $n^+$-type buffer layer 102, an $n^-$-type drain region 103, and a p-type base region 104, respectively.

The $n^+$-type buffer layer 102 is the $n^+$-type epitaxial layer 132, which has an impurity concentration that is at least equal to an impurity concentration of the $n^+$-type starting substrate 131, and a minority carrier lifetime that is sufficiently shorter than a minority carrier lifetime of the $n^-$-type drain region 103. The $n^-$-type drain region 103 is a portion of the $n^-$-type epitaxial layer 133 between the $n^+$-type buffer layer 102 and an n-type current spreading region 123 and is adjacent to these regions. The n-type current spreading region 123 is a diffused region formed by ion-implantation of an n-type impurity, in a portion of the $n^-$-type epitaxial layer 133, facing $n^+$-type source regions 105; the n-type current spreading region 123 has an impurity concentration that is higher than an impurity concentration of the $n^-$-type drain region 103.

An n-type impurity concentration (doped concentration of an n-type impurity) of the $n^-$-type drain region 103 is designed to be low so that when the silicon carbide semiconductor device 110 is off, electric field at bottoms of trenches 107 is at most equal to the dielectric breakdown blocking voltage (breakdown voltage) even during application of a high voltage such as a surge voltage occurring between the drain and source. As a result, a predetermined blocking voltage is maintained. On the other hand, when the n-type impurity concentration of the $n^-$-type drain region 103 is too low, resistance (on-resistance) between the drain and source when the silicon carbide semiconductor device 110 is on (during conduction) increases. Reference numerals 108 and 109 represent a gate insulating film and a gate electrode, respectively.

Thus, for the n-type impurity concentration of the n-type drain region 103, a suitable design value (numeric value) to obtain a predetermined on-resistance is prescribed according to the blocking voltage class. For example, the $n^-$-type drain region 103 is constituted by the $n^-$-type epitaxial layer 133, which is doped with only nitrogen, and the n-type impurity concentration (=nitrogen concentration) is in a range of $1\times10^{16}/cm^3$ (±20%) for a blocking voltage of 1.2 kV-class, is in a range of $3\times10^{15}/cm^3$ (±20%) for a blocking voltage of 3.3 kV-class, and is in a range of $1\times10^{15}/cm^3$ (±20%) for a blocking voltage of 6.5 kV-class.

As for a conventional semiconductor device, a device has been proposed that suppresses decreases in mobility at high temperatures by the presence of traps due to crystal defects induced by ion implantation in an effective resistance portion of a source resistance region (for example, refer to International Publication No. WO 2017/169777 (paragraph 0054, FIG. 10)). International Publication No. WO 2017/169777 discloses that a p-type base region is formed by ion implantation of aluminum and in the p-type base region, the source resistance region is formed by ion implantation of nitrogen, whereby the source resistance region includes the ion-implanted nitrogen and aluminum.

As for another conventional semiconductor device, a device has been proposed that is a MOSFET in which a drift layer is a parallel pn layer in which p-type regions and n-type regions with an increased impurity concentration are disposed alternating one another, widths of the n-type regions of the parallel pn layer are set and based on the widths of the n-type regions, impurity concentrations of the n-type regions of the parallel pn layer are set, whereby the rate of change of the on-resistance is suppressed (for example, refer to Japanese Laid-Open Patent Publication No. 2007-180116). Japanese Laid-Open Patent Publication No. 2007-180116 discloses that in an instance in which the width of an n-type region of the parallel pn layer is 0.2 μm, the impurity concentration of the n-type region is set to be $1\times10^{17}/cm^3$ or less.

Further, it has been reported that in a semiconductor device element such as a MOSFET, carrier mobility is dependent on and determined by a scattering mechanism and electron mobility is greatly affected by intervalley scattering in dominant lattice (phonon) scattering at high temperatures in the scattering mechanism and thus decreases, whereby the on-resistance increases when the temperature increases (for example, refer to Iwata, H., one other, "Donor and acceptor concentration dependence of the electron hole mobility and the hole scattering factor in n-type 4H— and 6H—Si", Journal of Applied Physics, USA, American Institute of Physics, 2001, Vol. 89, pp. 6228).

SUMMARY OF THE INVENTION

According to an embodiment of the present invention, a silicon carbide semiconductor device includes: a semiconductor substrate containing a semiconductor having a bandgap that is wider than a bandgap of silicon; and a device structure that is provided in the semiconductor substrate and has a predetermined blocking voltage, the device structure including a drift layer that is of an n-type. The drift layer contains a first impurity of an n-type and a second impurity of a second type. The predetermined blocking voltage is ensured by an n-type impurity concentration determined by subtracting a concentration of the second impurity from a concentration of the first impurity of the drift layer, the n-type impurity concentration being within a first range. A combined impurity concentration of the concentration of the first impurity and the concentration of the second impurity of the drift layer is in a second range. When the predetermined blocking voltage is a first blocking voltage class, the first range is $1\times10^{16}/cm^3\pm20\%$ and the second range is $3\times10^{16}/cm^3$ to $1.3\times10^{17}/cm^3$. When the predetermined blocking voltage is a second blocking voltage class, the first range is $3\times10^{15}/cm^3\pm20\%$ and the second range is $3\times10^{16}/cm^3$ to $1.1\times10^{17}/cm^3$. When the predetermined blocking voltage is a third blocking voltage class, the first range is $1\times10^{15}/cm^3\pm20\%$ and the second range is $3\times10^{16}/cm^3$ to $9\times10^{16}/cm^3$.

Objects, features, and advantages of the present invention are specifically set forth in or will become apparent from the following detailed description of the invention when read in conjunction with the accompanying drawings.

DETAILED DESCRIPTION OF THE INVENTION

Figure 8:
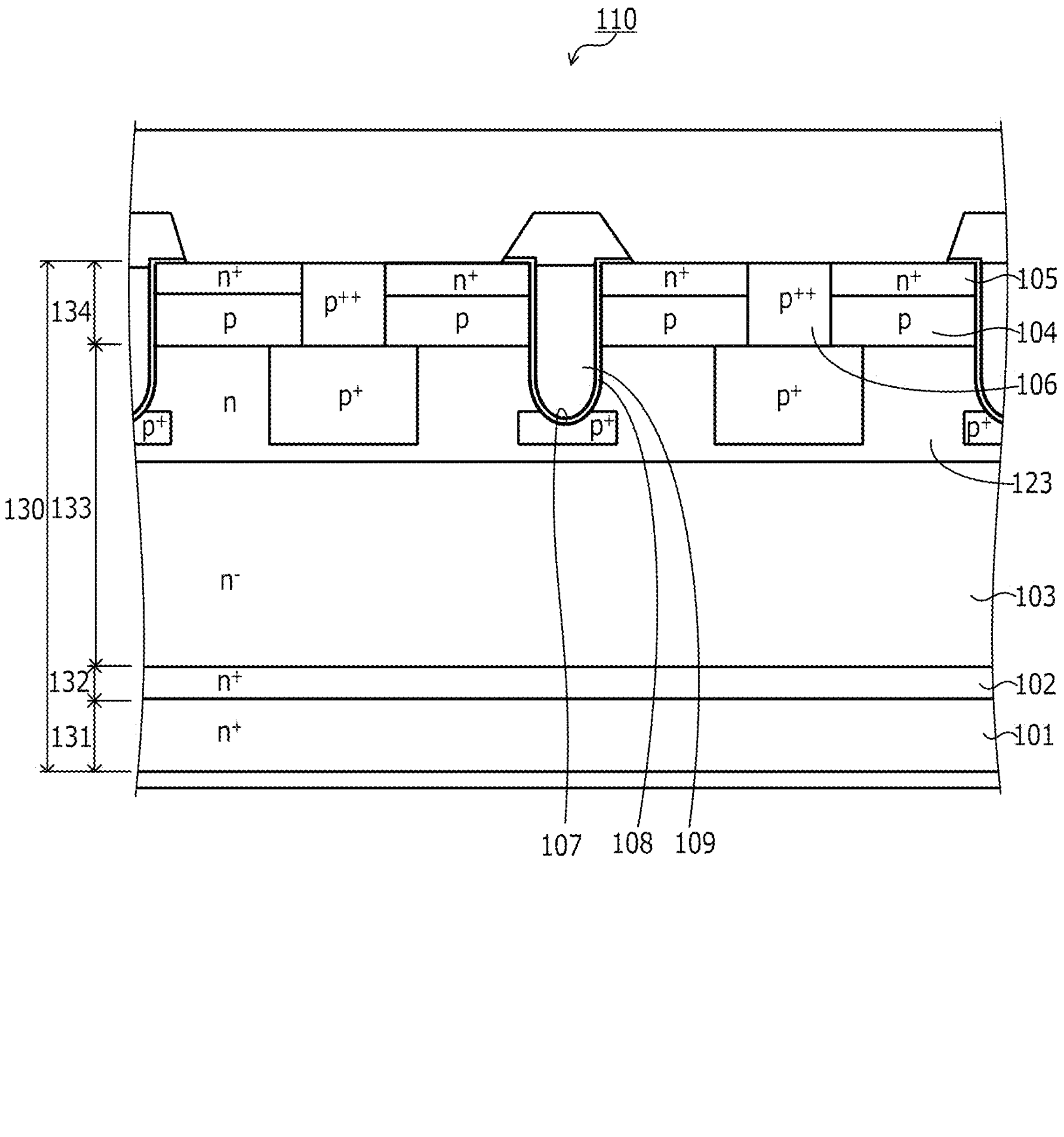
FIG.8 RELATED ART
FIG. 8 is a cross-sectional view depicting the structure of a conventional silicon carbide semiconductor device.

First, problems associated with the conventional techniques are discussed. In the semiconductor device element, such as the MOSFET, that configures the silicon carbide semiconductor device 110 described above (refer to FIG. 8), the increase of the on-resistance is great at high temperatures and therefore, conduction loss increases. For example, in an instance in which the MOSFET is used as a device for an inverter, the temperature increases, exceeding a maximum allowable temperature (for example, about 175 degrees C.) during operation and therefore, a cooling function is included so that the maximum allowable temperature is not exceeded. Nonetheless, low conduction loss even at the maximum allowable temperature is important for the semiconductor device element.

Embodiments of a silicon carbide semiconductor device according to the present invention is described in detail with reference to the accompanying drawings. In the present description and accompanying drawings, layers and regions prefixed with n or p mean that majority carriers are electrons or holes. Additionally, + or −appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
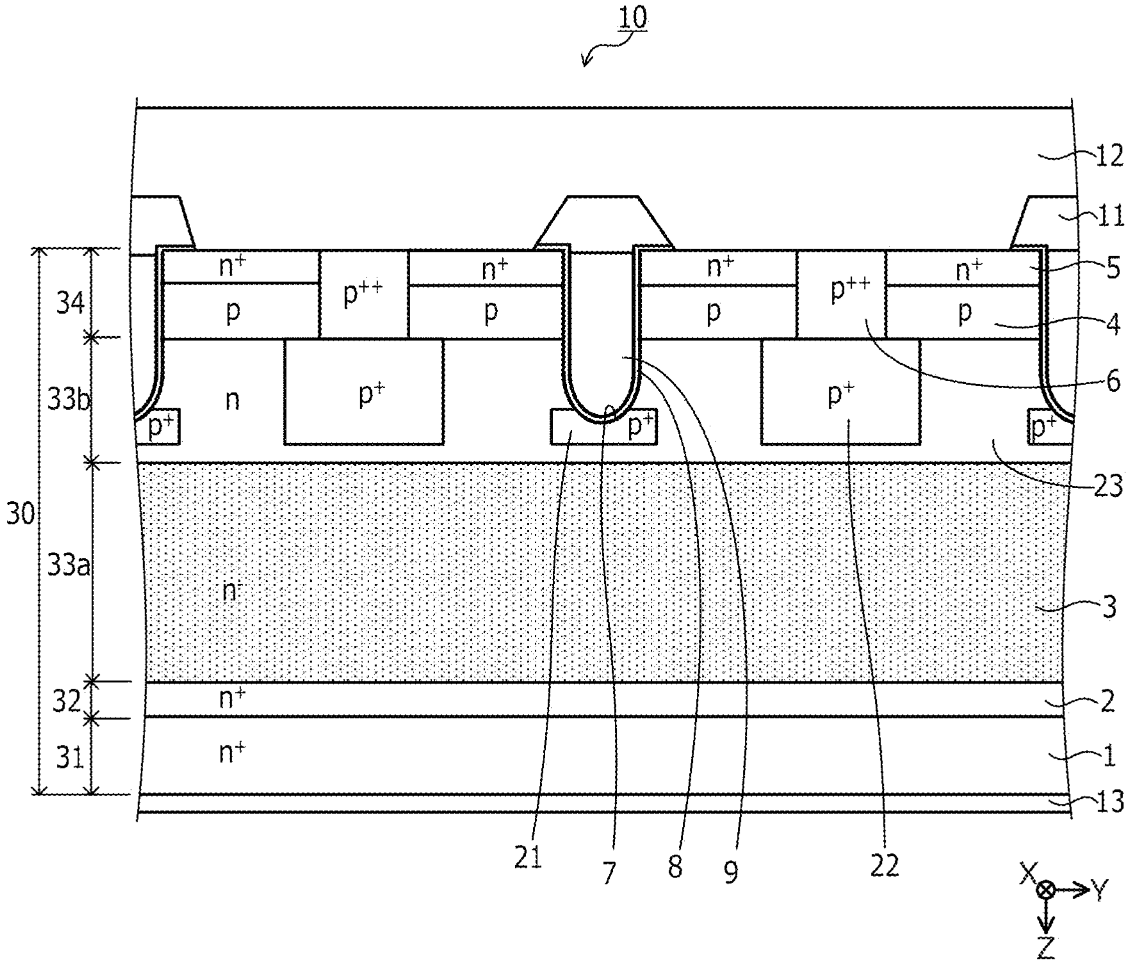
FIG. 1 is a cross-sectional view depicting a structure of a silicon carbide semiconductor device according to an embodiment.

A structure of a silicon carbide semiconductor device according to an embodiment is described. FIG. 1 is a cross-sectional view depicting the structure of the silicon carbide semiconductor device according to the embodiment. A silicon carbide semiconductor device 10 according to the embodiment depicted in FIG. 1 is a vertical MOSFET having a trench gate structure fabricated (manufactured) using a semiconductor substrate (semiconductor chip) 30 that contains silicon carbide (SiC) as a semiconductor material, the silicon carbide semiconductor device 10 being useful for instances in which, for example, the blocking voltage class in a range of about 1.2 kV to 6.5 kV. The blocking voltage (or withstanding voltage) is a voltage limit at which no erroneous operation or destruction of the MOSFET occurs.

The semiconductor substrate 30 is an epitaxial substrate in which epitaxial layers 32, 33*a*, 33*b*, and 34 constituting, respectively, an $n^+$-type buffer layer 2, an $n^-$-type drift layer 3, an n-type current spreading region 23, and a p-type base region 4 are sequentially stacked on a front surface of an $n^+$-type starting substrate 31 that contains silicon carbide as a semiconductor material. A crystal structure of the semiconductor substrate 30, for example, may be a 4-layer periodic hexagonal crystal silicon carbide (4H—SiC). The semiconductor substrate 30 has, as a front surface, a main surface having the p-type epitaxial layer 34 and has, as a back surface, a main surface having the $n^+$-type starting substrate 31 (back surface of the $n^+$-type starting substrate 31).

An active region through which a main current flows when the MOSFET is in an on state is provided, for example, in a center (chip center) of the semiconductor substrate 30. A periphery of the active region is surrounded by a non-depicted edge termination region. The edge termination region is a region that is between the active region and an end (chip end) of the semiconductor substrate 30; the edge termination region mitigates electric field of a front side of the semiconductor substrate 30 and sustains the blocking voltage. In the edge termination region, a voltage withstanding structure such as a junction termination extension (JTE) structure is disposed.

An $n^+$-type drain region 1, the $n^+$-type buffer layer 2, and the $n^-$-type drift layer 3 are each provided having a uniform thickness from the center of the semiconductor substrate 30 to the end of the semiconductor substrate 30. A uniform thickness means that the thickness is the same within a range that includes allowable error due to process variation. The $n^+$-type starting substrate 31 constitutes the $n^+$-type drain region 1. The $n^+$-type buffer layer 2 is adjacent to the $n^+$-type drain region 1 in a depth direction Z and is formed by the $n^+$-type epitaxial layer 32 that is epitaxially grown and doped with an n-type impurity such as, for example, nitrogen (N).

The $n^+$-type buffer layer 2 has an impurity concentration that is equal to or greater than an impurity concentration the $n^+$-type starting substrate 31 and a minority carrier lifetime that is sufficiently shorter than a minority carrier lifetime of the $n^-$-type drift layer 3. The $n^+$-type buffer layer 2 is designed so that expansion of stacking faults from an interface between the $n^+$-type epitaxial layer 32 and the $n^+$-type starting substrate 31, to the epitaxial layers 32, 33*a*, 33*b*, and 34 during forward conduction of a parasitic diode formed by pn junctions between the p-type base region 4, later-described $p^+$-type regions 22, and the n-type current spreading region 23 is suppressed.

The $n^-$-type drift layer 3 (hatched portion) is formed by the $n^-$-type epitaxial layer 33*a* that is doped with an n-type impurity such as, for example, nitrogen as an n-type dopant and aluminum (Al), which is a p-type impurity, is further added (so-called "co-doping") as a p-type dopant, the n-type drift layer 3 being adjacent to the $n^+$-type buffer layer 2 in the depth direction Z and functioning as a drift region. Nitrogen and aluminum are contained substantially uniformly throughout the entire $n^-$-type drift layer 3. Substantially uniform means that the nitrogen concentration (donor concentration) and the aluminum concentration (acceptor concentration) are equal to each other within a range that includes allowable error due to process variation.

Aluminum is co-doped in the $n^-$-type drift layer 3, whereby temperature dependence of the $n^-$-type drift layer 3 changes and increases of the on-resistance at high temperatures (for example, about 75 degrees C. and higher) are suppressed. Further, aluminum is co-doped in the $n^-$-type drift layer 3, whereby the n-type impurity concentration of the $n^-$-type drift layer may be reduced to be the same as the n-type impurity concentration (=nitrogen concentration) of the $n^-$-type drain region 103 that is doped with only nitrogen in the conventional structure (refer to FIG. 8). Thus, about the same blocking voltage as that of the conventional structure with the $n^-$-type drain region 103 having substantially the same thickness and substantially the same n-type impurity concentration is realized.

The n-type impurity concentration of the $n^-$-type drift layer 3 is an impurity concentration obtained by subtracting the aluminum concentration from the nitrogen concentration of the $n^-$-type drift layer 3. A predetermined blocking voltage is realized by the impurity concentration obtained by subtracting the aluminum concentration from the nitrogen concentration of the $n^-$-type drift layer 3. In particular, for example, the n-type impurity concentration of the $n^-$-type drift layer 3 is in a range of $1\times10^{16}/cm^3$ (±20%) for a blocking voltage of 1.2 kV-class (first blocking voltage class), is in a range of $3\times10^{15}/cm^3$ (±20%) for a blocking voltage of 3.3 kV-class (second blocking voltage class), and is in a range of $1\times10^{15}/cm^3$ (±20%) for a blocking voltage of 6.5 kV-class (third blocking voltage class).

A total impurity concentration of nitrogen and aluminum (impurity concentration obtained by adding the nitrogen concentration and the aluminum concentration) of the $n^-$-type drift layer 3 is in a range of, for example, about $3\times10^{16}/cm^3$ to $1.3\times10^{17}/cm^3$ for a blocking voltage of 1.2 kV-class. The total impurity concentration of nitrogen and aluminum of the $n^-$-type drift layer 3 is in a range of, for example, about $3\times10^{16}/cm^3$ to $1.1\times10^{17}/cm^3$ for a blocking voltage of 3.3 kV-class. The total impurity concentration of nitrogen and aluminum of the $n^-$-type drift layer 3 is in a range of, for example, about $3\times10^{16}/cm^3$ to $9\times10^{16}/cm^3$ for a blocking voltage of 6.5 kV-class.

The total impurity concentration of nitrogen and aluminum of the $n^-$-type drift layer 3 is within the ranges above, and the increases in the on-resistance are suppressed when the total impurity concentration is low. While uniformity of the impurity concentration within the semiconductor substrate 30 surface and controllability of impurity concentration during growth of the $n^-$-type epitaxial layer 33*a* increases the higher is the total impurity concentration of nitrogen and aluminum of the $n^-$-type drift layer 3, electron mobility decreases due to ionized impurity scattering, whereby the on-resistance increases. In the $n^-$-type drift layer 3, boron (B), which is a p-type impurity, may be co-doped instead of aluminum, and instead of nitrogen, an n-type impurity such as phosphorus (P) may be doped.

The n-type current spreading region 23 is a so-called current spreading layer (CSL) that reduces carrier spreading resistance. The n-type current spreading region 23, for example, is a portion of the nitrogen-doped epitaxial layer 33*b* of an n-type, excluding later-described the $p^+$-type regions 21, 22. Alternatively, the n-type current spreading region 23, for example, is a diffused region formed in the nitrogen-doped epitaxial layer 33*b* of an $n^-$-type, by ion implantation. In the n-type current spreading region 23, similarly to the $n^-$-type drift layer 3, aluminum or boron may be co-doped.

The n-type current spreading region 23 may be omitted. In an instance in which the n-type current spreading region 23 is omitted, the epitaxial layer 33*b* is disposed between the $n^-$-type epitaxial layer 33*a* and the p-type epitaxial layer 34, and the later-described $p^+$-type regions 21, 22 are provided in the $n^-$-type epitaxial layer 33*b*. In this instance, the epitaxial layer 33*b* of an $n^-$-type functions as a drift region together with the $n^-$-type drift layer 3 (the $n^-$-type epitaxial layer 33*a*). Hereinafter, an instance in which the n-type current spreading region 23 is provided is described as an example.

The p-type base region 4 is a portion of the p-type epitaxial layer 34, excluding later-described $n^+$-type source regions 5 and $p^{++}$-type contact regions 6. The p-type base region 4 is provided between the front surface of the semiconductor substrate 30 and the n-type current spreading region 23. The p-type base region 4 extends from the active region outward (toward the chip end), nearly to a border (not depicted) between the active region and the edge termination region. The $n^+$-type source regions 5 and the $p^{++}$-type contact regions 6 are each selectively provided between the front surface of the semiconductor substrate 30 and the p-type base region 4.

The $n^+$-type source regions 5 and the $p^{++}$-type contact regions 6 are diffusion regions formed in the p-type epitaxial layer 34 by ion implantation, are in contact with the p-type base region 4, and are exposed at the front surface of the semiconductor substrate 30. Being exposed at the front surface of the semiconductor substrate 30 means being provided in a surface layer (at the front surface) of the semiconductor substrate 30, in contact with a source electrode 12. The $p^{++}$-type contact regions 6 may be omitted and instead of the $p^{++}$-type contact regions 6, the p-type base region 4 may be exposed at the front surface of the semiconductor substrate 30.

Trenches 7 penetrate through the $n^+$-type source regions 5 and the p-type base region 4 from the front surface of the semiconductor substrate 30 and reach the n-type current spreading region 23. In the trenches 7, gate electrodes 9 are provided via a gate insulating film 8. The p-type base region 4, the $n^+$-type source regions 5, and the $p^{++}$-type contact regions 6 are provided between the trenches 7 that are adjacent to one another; these regions, the trenches 7, the gate insulating film 8, and the gate electrodes 9 configure the trench gate structure.

The regions between the trenches 7 that are adjacent to one another, the trenches 7, and the gate electrodes 9, for example, are disposed in a striped pattern that extends in a first direction X that is parallel to the front surface of the semiconductor substrate 30. In the n-type current spreading region 23, the $p^+$-type regions 21, 22 are selectively provided apart from one another in a second direction Y that is parallel to the front surface of the semiconductor substrate 30 and orthogonal to the first direction X. The $p^+$-type regions 21, 22 are electrically connected to the source electrode 12, are fixed at a source potential, are depleted when the MOSFET is off, and have a function of mitigating electric field applied to bottoms of the trenches 7.

The $p^+$-type regions 21, 22 are diffused regions formed in the epitaxial layer 33*b* by ion implantation. The $p^+$-type regions 21 are provided apart from the p-type base region 4, at positions that face the bottoms of the trenches 7 in the depth direction Z and are closer to the $n^+$-type drain region 1 than is an interface between the p-type base region 4 and the n-type current spreading region 23. Each of the $p^+$-type regions 22 is provided between a respective adjacent two of the trenches 7, apart from the trenches 7 and the $p^+$-type regions 21, and in contact with the p-type base region 4. An interlayer insulating film 11 is provided at the entire front surface of the semiconductor substrate 30 and covers the gate electrodes 9.

The source electrode 12 is in contact with and electrically connected to the $n^+$-type source regions 5 and the $p^{++}$-type contact regions 6, via contact holes in the interlayer insulating film 11. In an instance in which the $p^{++}$-type contact regions 6 are omitted, the source electrode 12 is in contact with the p-type base region 4 instead of with the $p^{++}$-type contact regions 6. A drain electrode 13 is provided on the entire back surface (the back surface of the $n^+$-type starting substrate 31) of the semiconductor substrate 30, in contact with and electrically connected to the $n^+$-type drain region 1 (the $n^+$-type starting substrate 31).

Figure 2:
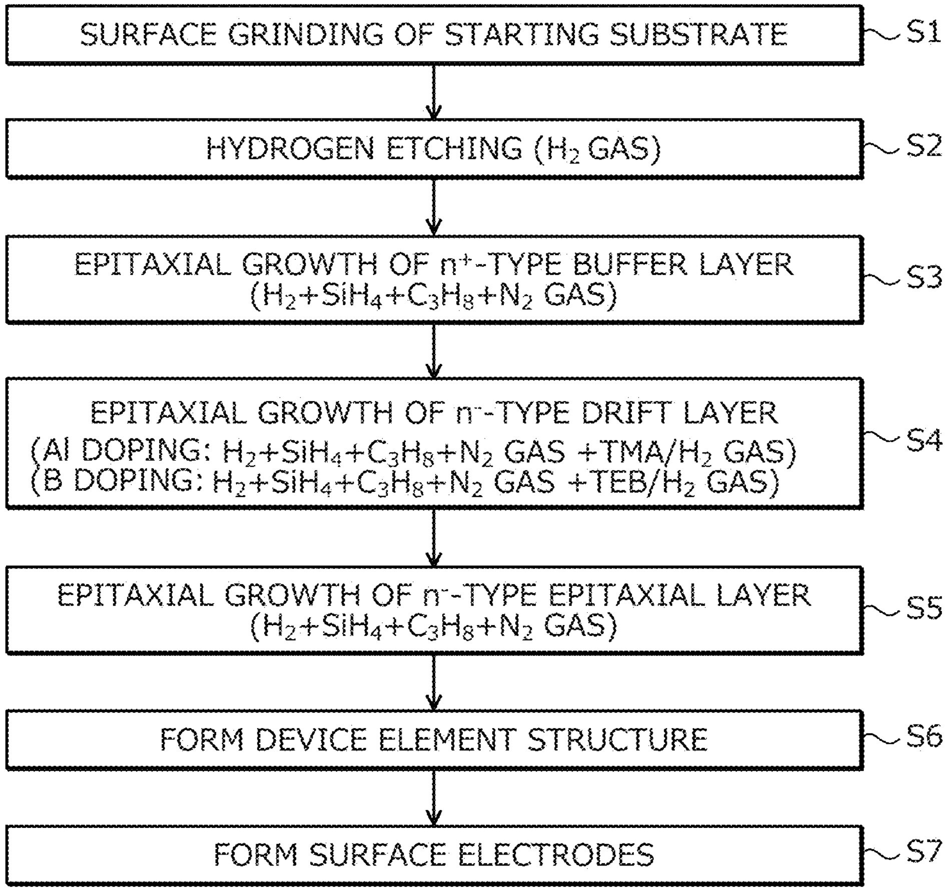
FIG. 2 is a flowchart depicting an outline a method of manufacturing a semiconductor device according to the embodiment.

Next, a method of manufacturing the silicon carbide semiconductor device 10 according to the embodiment is described. FIG. 2 is a flowchart depicting an outline the method of manufacturing the semiconductor device according to the embodiment. First, the $n^+$-type starting substrate (semiconductor wafer) 31 that contains silicon carbide and has a polished surface is prepared (step S1), and the $n^+$-type starting substrate 31 is cleaned by a general cleaning method (an organic cleaning method, an RCA cleaning method). Next, the $n^+$-type starting substrate 31 is placed in an epitaxial growth furnace (not depicted) and, for example, hydrogen ($H_2$) gas is supplied in the furnace as a carrier gas (step S2).

Next, continuous with the process at step S2, while the carrier gas continues to be supplied, a source gas, a doping gas, and an additive gas are supplied in the furnace and under this atmosphere of mixed gases, the $n^+$-type epitaxial layer 32 that constitutes the $n^+$-type buffer layer 2 is deposited (formed) on the front surface of the $n^+$-type starting substrate 31 (step S3). At this time, as the source gas, for example, a monosilane ($SiH_4$) gas containing silicon (Si), for example, a propane ($C_3H_8$) containing carbon (C), may be supplied in the furnace. As the doping gas, for example, a nitrogen ($N_2$) gas containing nitrogen (N) is supplied in the furnace.

Next, under the mixed gas atmosphere of the source gas, the carrier gas, the doping gas, and the additive gas continuously supplied in the furnace continuous with the process at step S3, a gas containing aluminum (Al) is further supplied as a doping gas, whereby the $n^-$-type epitaxial layer 33*a* that constitutes the $n^-$-type drift layer 3 is deposited on the $n^+$-type epitaxial layer 32 (step S4). In the process at step S4, instead of a gas containing aluminum, a gas containing boron (B) may be supplied as the doping gas to deposit the $n^-$-type epitaxial layer 33*a*.

In the process at step S4, the gas containing aluminum additionally supplied as a doping gas, for example, may be a gas (TMA/$H_2$ gas) in which tri-methyl aluminum (TMA) is diluted in a carrier gas. Further, in the process at step S4, the gas containing boron additionally supplied as a doping gas, for example, may be a gas (TEB/$H_2$ gas) in which boron tri-ethyl-boron (TEB) is diluted in a carrier gas.

Next, continuous with the process at step S4, under the atmosphere of the mixed gas supplied in the furnace, the epitaxial layer 33*b* of an $n^-$-type or an n-type is deposited on the $n^-$-type epitaxial layer 33*a*; the epitaxial layer 33*b* constitutes the n-type current spreading region 23 (step S5). In an instance in which aluminum (or boron) is co-doped in the epitaxial layer 33*b*, similarly to the process at step S4, a gas containing aluminum (or boron) suffices to be supplied in the furnace. Due to mixing (auto-doping) of an impurity adhered to a member, etc. in the furnace during epitaxial growth of the $n^-$-type drift layer 3, aluminum (or boron) may be co-doped in the epitaxial layer 33*b*.

In the epitaxial substrate at this time point, the epitaxial layers 32, 33*a*, 33*b* constituting, respectively, the $n^+$-type buffer layer 2, the $n^-$-type drift layer 3, and the n-type current spreading region 23 are sequentially stacked on the $n^+$-type starting substrate 31. A predetermined device structure is formed in the epitaxial substrate (step S6). In particular, in an instance in which the epitaxial layer 33*b* of an $n^-$-type is formed having an n-type impurity concentration that is lower than that of the n-type current spreading region 23, in the process at step S6, ion implantation is repeatedly performed under different conditions to, thereby, selectively form the n-type current spreading region 23 and the $p^+$-type regions 21, 22 in the epitaxial layer 33*b*.

Alternatively, in an instance in which the epitaxial layer 33*b* of an n-type is formed having the same n-type impurity concentration as that of the n-type current spreading region 23, in the process at step S6, ion implantation is repeatedly performed under different conditions to, thereby, selectively form the $p^+$-type regions 21, 22 in the epitaxial layer 33*b*. The epitaxial layer 33*b* may be deposited in two stages and in the portion formed in the first stage, a lower portion of the n-type current spreading region 23, the $p^+$-type regions 21, and lower portions of the $p^+$-type regions 22 may each be selectively formed while in the portion formed in the second stage, an upper portion of the n-type current spreading region 23 and upper portions of the $p^+$-type regions 22 may each be selectively formed.

In addition, the p-type epitaxial layer 34 that constitutes the p-type base region 4 is deposited on the epitaxial layer 33*b*, and the trench gate structure is formed in the p-type epitaxial layer 34. In particular, the p-type epitaxial layer 34 that constitutes the p-type base region 4 is deposited on the epitaxial layer 33*b*, whereby the semiconductor substrate (semiconductor wafer) 30 is fabricated in which the epitaxial layers 32, 33*a*, 33*b*, and 34 constituting, respectively, the $n^+$-type buffer layer 2, the $n^-$-type drift layer 3, the n-type current spreading region 23, and the p-type base region 4 are sequentially stacked on the $n^+$-type starting substrate 31.

Further, in implantation is repeatedly performed under different conditions, thereby, selectively forming the $n^+$-type source regions 5 and the $p^{++}$-type contact regions 6 in the p-type epitaxial layer 34. The trenches 7, the gate insulating film 8, and the gate electrodes 9 are formed in the front side of the semiconductor substrate 30 by a general method. Next, the source electrode 12 and the drain electrode 13 are formed, respectively, on the surfaces of the semiconductor substrate 30 (step S7). Thereafter, the semiconductor substrate 30 is cut (diced) into individual chips, whereby the MOSFET depicted in FIG. 1 is completed.

Figure 3:
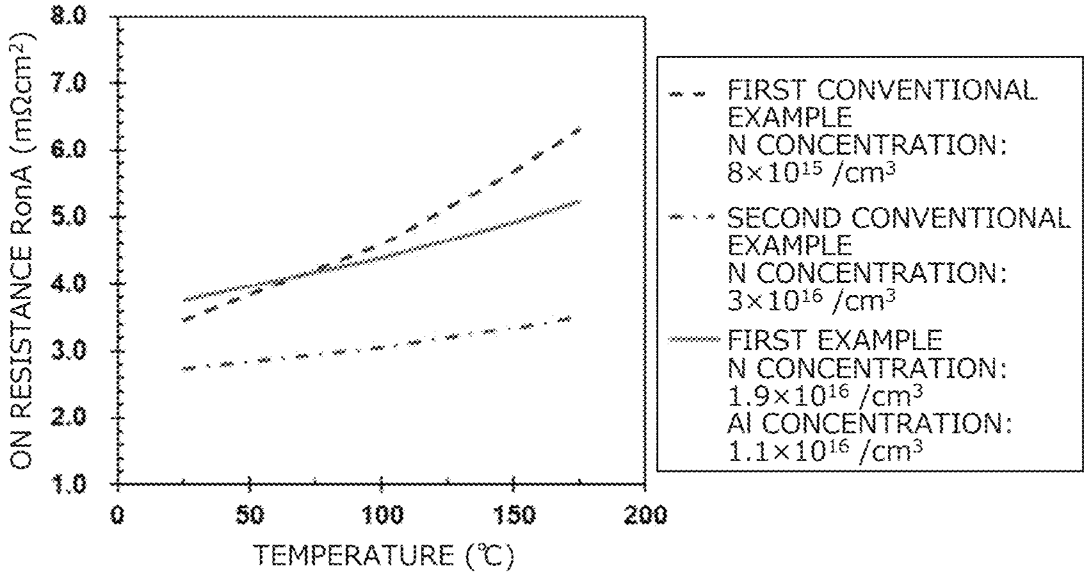
FIG. 3 is a characteristics diagram depicting results of simulation of temperature dependence of on-resistance of a first example.
Figure 4:
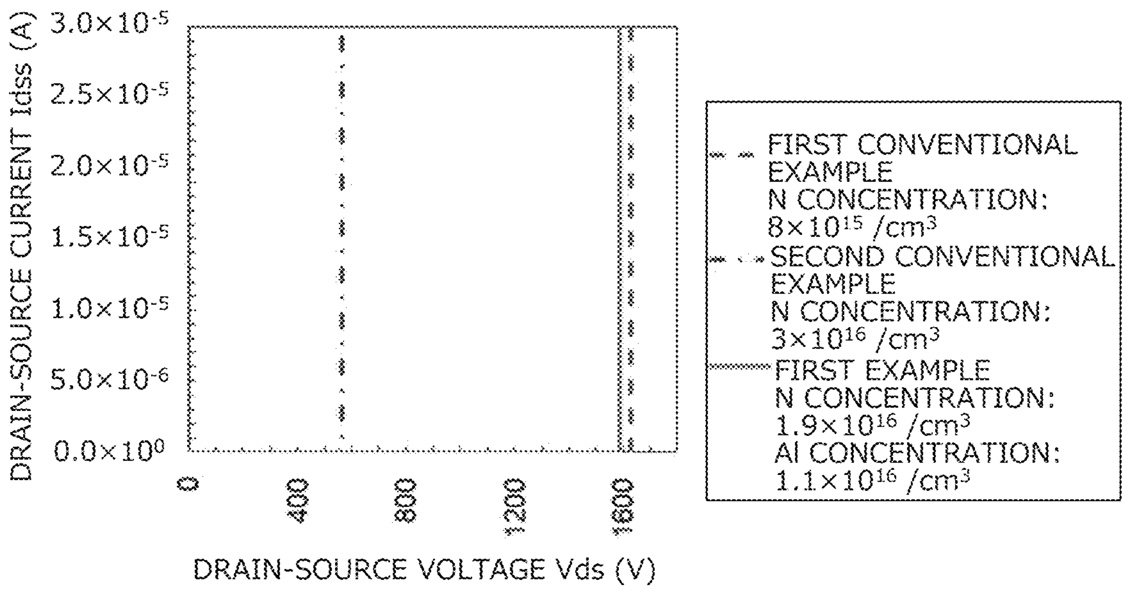
FIG. 4 is a characteristics diagram depicting results of simulation of blocking voltage characteristics of the first example.

Next, temperature dependence of the on-resistance and blocking voltage (dielectric breakdown blocking voltage) characteristics of the silicon carbide semiconductor device 10 according to the embodiment are described. FIG. 3 is a characteristics diagram depicting results of simulation of temperature dependence of the on-resistance of a first example. FIG. 4 is a characteristics diagram depicting results of simulation of blocking voltage characteristics of the first example.

The first example is a MOSFET having the structure of the silicon carbide semiconductor device 10 according to the embodiment described above (refer to FIG. 1) and has the $n^-$-type drift layer 3 that contains nitrogen and aluminum as dopants. The $n^-$-type drift layer 3 of the first example is assumed to have a nitrogen concentration and an aluminum concentration of $1.9\times10^{16}/cm^3$ and $1.1\times10^{16}/cm^3$, respectively, and a total impurity concentration of nitrogen and aluminum of $3\times10^{16}/cm^3$. Thus, the n-type impurity concentration of the $n^-$-type drift layer 3 for realizing a blocking voltage of 1.2 kV-class is $8\times10^{15}/cm^3$.

In FIGS. 3 and 4, for comparison, simulation results of first and second conventional examples are also shown. The first and second conventional examples are MOSFETs having the structure of the conventional silicon carbide semiconductor device 110 described above (refer to FIG. 8) and have the $n^-$-type drain region 103 that contains only nitrogen as a dopant. The total impurity concentration (=nitrogen concentration (the n-type impurity concentration)) of the $n^-$-type drain region 103 differs in the first and second conventional examples. The total impurity concentration of the $n^-$-type drain region 103 in the first and second conventional examples are assumed to be $8\times10^{15}/cm^3$ and $3\times10^{16}/cm^3$, respectively.

In the first conventional example, while a high blocking voltage exceeding 1.2 kV is achieved (FIG. 4), it was confirmed that the on-resistance (RonA) increases the higher the temperature rises (FIG. 3). In the second conventional example, it was confirmed that while the nitrogen concentration of the $n^-$-type drain region 103 is higher than that in the first conventional example, whereby increases in the on-resistance are suppressed (FIG. 3), the blocking voltage is lower compared to the first conventional example (FIG. 4). On the other hand, in the first example, it was confirmed that increase of the on-resistance at a high temperature of about 75 degrees C. or higher was suppressed compared to the first conventional example (FIG. 3), and a blocking voltage about the same as that of the first conventional example was maintained (FIG. 4).

Carrier mobility is dependent on and determined by the scattering mechanism and electron mobility is greatly affected by intervalley scattering in dominant lattice (phonon) scattering at high temperatures in the scattering mechanism and thus, decreases, whereby the on-resistance increases when the temperature increases. In an instance of 4H—SiC, a main factor has been reported to be decreased electron mobility, for example, at a temperature T of about 400K, due to intervalley scattering (refer to Iwata, H., one other, "Donor and acceptor concentration dependence of the electron hole mobility and the hole scattering factor in n-type 4H— and 6H—SiC").

In the first example, the total impurity concentration of nitrogen and aluminum of the $n^-$-type drift layer 3 is assumed to be at least $3\times10^{16}/cm^3$, whereby intervalley scattering, which lowers electron mobility at high temperatures, may be suppressed. Thus, device element resistance at high temperatures is presumed to decrease.

Figure 5:
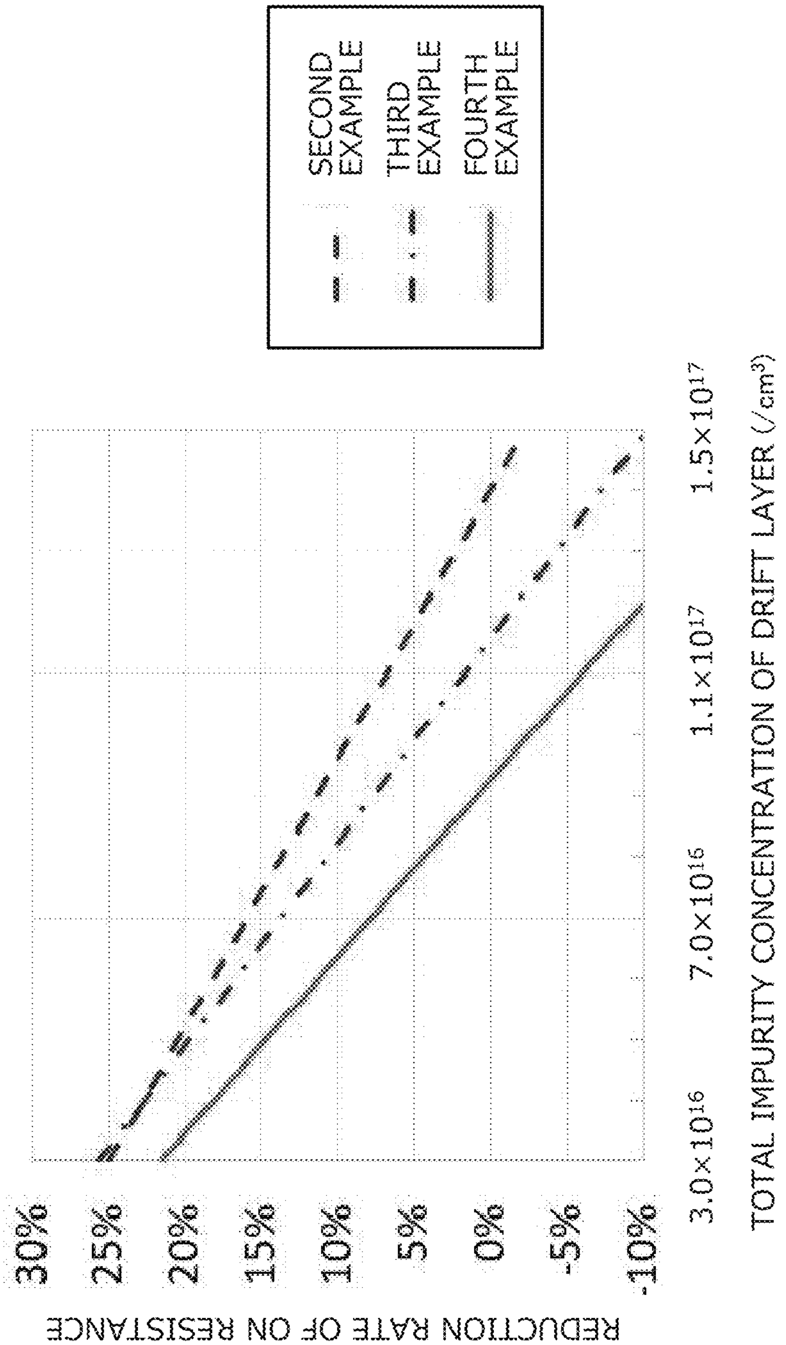
FIG. 5 is a characteristics diagram depicting results of simulation of a total impurity concentration of a drift layer and on-resistance of second to fourth examples.

The total impurity concentration of nitrogen and aluminum of the $n^-$-type drift layer 3 and on-resistance of the silicon carbide semiconductor device 10 according to the embodiment were verified. FIG. 5 is a characteristics diagram depicting results of simulation of the total impurity concentration of the drift layer and on-resistance of second to fourth examples. The second to fourth examples are the MOSFET having the structure of the silicon carbide semiconductor device 10 according to the embodiment described above (refer to FIG. 1) and for each, the on-resistance at a temperature of 175 degrees C. was simulated by variously changing the total impurity concentration of nitrogen and aluminum of the $n^-$-type drift layer 3.

In the second to fourth examples, the nitrogen concentration and the aluminum concentration of the $n^-$-type drift layer 3 were variously changed so that the n-type impurity concentration becomes a value whereby the impurity concentration obtained by subtracting the aluminum concentration from the nitrogen concentration of the $n^-$-type drift layer 3 realizes a blocking voltage of 1.2 kV, a blocking voltage of 3.3 kV, and a blocking voltage of 6.5 kV, respectively. Regarding the on-resistance of the second to fourth examples, results of simulating the reduction rate thereof (horizontal axis: reduction rate of on-resistance) based on the on-resistance of a conventional structure (refer to FIG. 8) having about the same blocking voltage as that when the $n^-$-type drain region 103 is doped with only nitrogen are depicted in FIG. 5.

From the results depicted in FIG. 5, it was confirmed that in the second to fourth examples, by setting the total impurity concentration of nitrogen and aluminum of the $n^-$-type drift layer 3 to at least $3\times10^{16}/cm^3$, the on-resistance could be reduced. On the other hand, in the second to fourth examples, it was confirmed that the reduction rate of the on-resistance decreased when the total impurity concentration of nitrogen and aluminum of the $n^-$-type drift layer 3 exceeded a predetermined value, the on-resistance did not decrease (i.e., the reduction rate of the on-resistance was 0% or less).

Thus, the impurity concentration obtained by subtracting the aluminum concentration from the nitrogen concentration of the $n^-$-type drift layer 3 is set to the n-type impurity concentration that realizes the predetermined blocking voltage. In addition, an upper limit of the total impurity concentration of nitrogen and aluminum of the $n^-$-type drift layer 3 suffices to be set to about $1.3\times10^{17}/cm^3$ for a blocking voltage of 1.2 kV-class, about $1.1\times10^{17}/cm^3$ for a blocking voltage of 3.3 kV-class, and about $9\times10^{16}/cm^3$ for a blocking voltage of 6.5 kV-class, so that the reduction rate of the on-resistance is greater than 0%.

While not depicted, in an instance in which the n-type drift layer 3 contains boron instead of aluminum, effects similar to those of the first to fourth examples are obtained.

Figure 6:
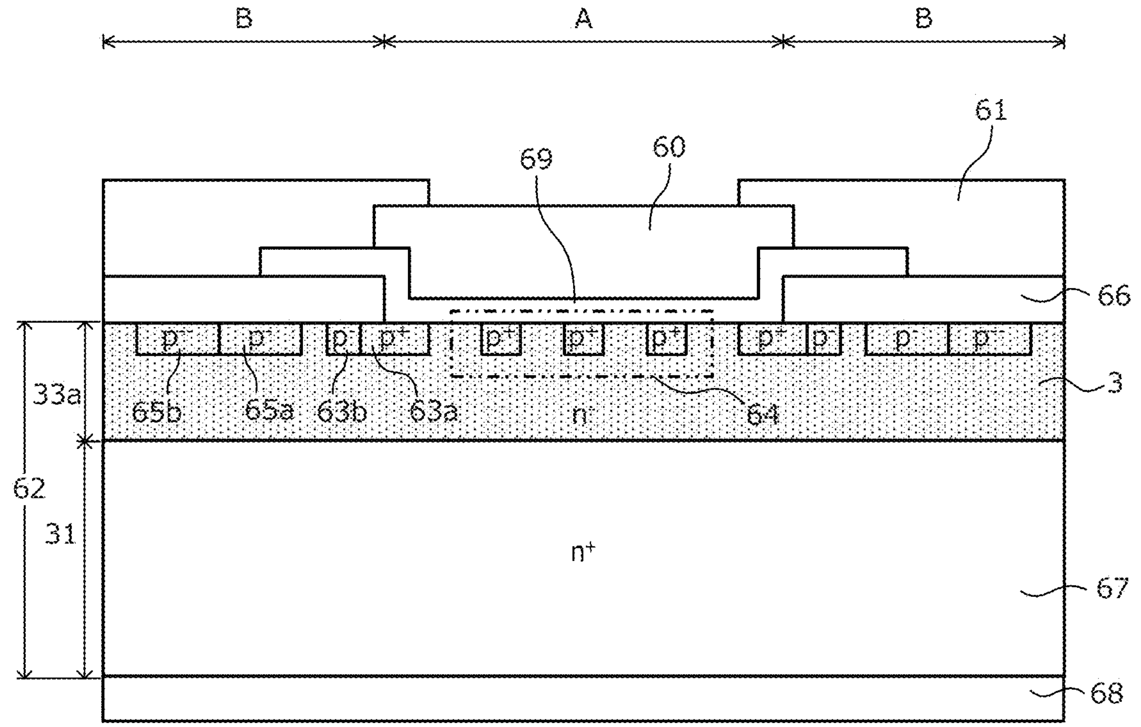
FIG. 6 is a cross-sectional view depicting a structure of a silicon carbide semiconductor device according to another example of the present invention.
Figure 7:
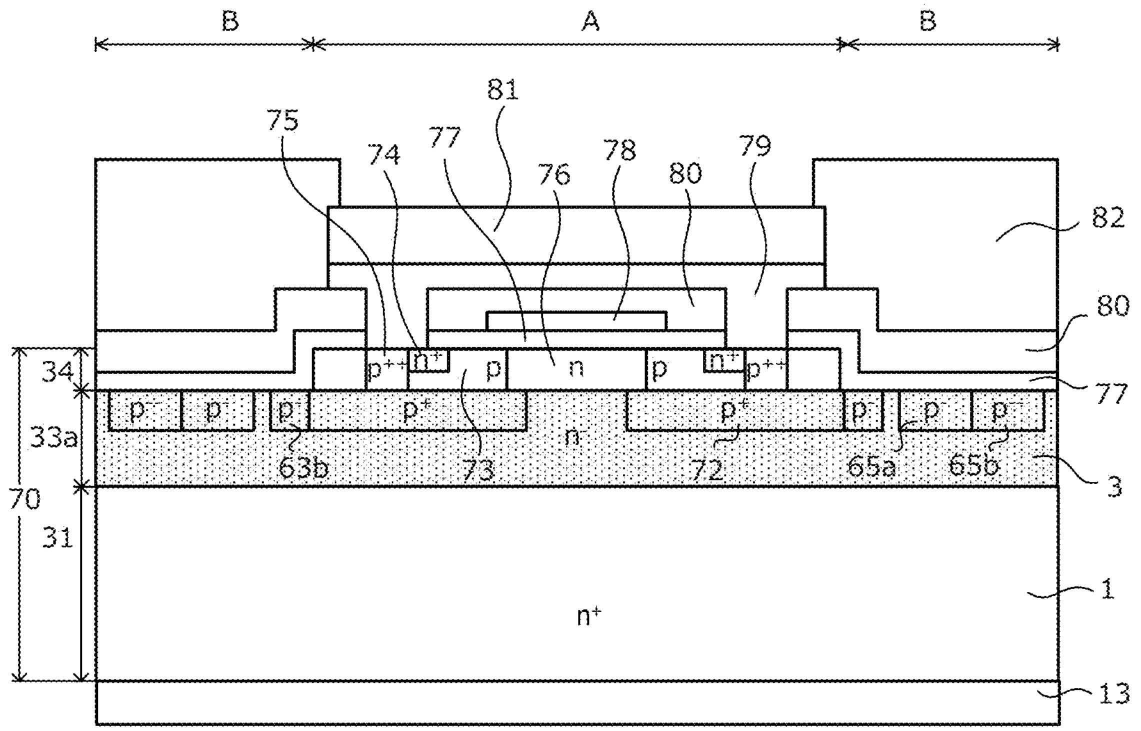
FIG. 7 is a cross-sectional view depicting a structure of a silicon carbide semiconductor device according to another example of the present invention.

FIGS. 6 and 7 are cross-sectional views depicting a structure of a silicon carbide semiconductor device according to other examples of the present invention. In the embodiment described above, while an example in which the device structure is a trench gate type is described, the device structure of the present invention is not limited to a trench gate structure. In FIGS. 6 and 7, parts identical to those in FIG. 1 are given the same reference characters used in FIG. 1.

FIG. 6 depicts an example in which the device structure is a Schottky barrier diode (SBD). A semiconductor substrate (semiconductor chip) 62 containing silicon carbide as a semiconductor material has a surface layer at the front surface thereof and in the surface layer, a $p^+$-type region 63*a*, a $p^-$-type region 63*b*, $p^+$-type regions 64 configuring a JBS structure, a $p^-$-type region 65*a* and a $p^{--}$-type region 65*b* configuring a termination structure are selectively provided. The semiconductor substrate 62, is formed by epitaxially growing the $n^-$-type epitaxial layer 33*a* that constitutes the $n^-$-type drift layer 3, on the $n^+$-type starting substrate 31 that constitutes an $n^+$-type cathode region 67.

As described above, in the $n^-$-type epitaxial layer 33*a* (hatched portion), an n-type impurity, for example, nitrogen or phosphorus is doped as an n-type dopant and a p-type impurity such as aluminum or boron, which are p-type impurities, is co-doped as a p-type dopant. A portion of the $n^-$-type epitaxial layer 33*a* other than the $p^+$-type region 63*a*, the $p^-$-type region 63*b*, the $p^-$-type region 65*a*, and the $p^{--}$-type region 65*b* is the $n^-$-type drift layer 3 that functions as a drift region. The $p^+$-type region 63*a*, the $p^-$-type region 63*b*, the $p^-$-type region 65*a*, and the $p^{--}$-type region 65*b* are diffusion regions formed in surface regions of the $n^-$-type epitaxial layer 33*a* by ion implantation of a p-type impurity.

The $p^+$-type region 63*a* is provided spanning into an active region A, from a voltage withstanding structure portion B surrounding a periphery of the active region A in which the device structure of a diode is formed. A portion of the $p^+$-type region 63*a* provided in the active region A is in contact with a Schottky electrode 69. The $p^-$-type region 63*b* surrounds a periphery of the $p^+$-type region 63*a* and is provided in contact with the $p^+$-type region 63*a* and closer to an end (chip end) of the semiconductor substrate 62 than is the $p^+$-type region 63*a*. The active region A is a region through which current flows during an on state. The voltage withstanding structure portion B is a region that mitigates electric field of the front (surface having the $n^-$-type drift layer 3) side of the semiconductor substrate 62 and sustains the blocking voltage.

The $p^+$-type region 63*a* has an impurity concentration that is higher than that of the $p^-$-type region 63*b*, the $p^-$-type region 65*a*, and the $p^{--}$-type region 65*b* and is doped with, for example, aluminum (Al). The $p^+$-type region 63*a* and the $p^-$-type region 63*b* have a function of preventing electric field concentration at ends of the $n^-$-type epitaxial layer 33*a* joined to the Schottky electrode 69. In other words, the $p^+$-type region 63*a* and the $p^-$-type region 63*b* form a structure that mitigates electric field applied to the ends of the $n^-$-type drift layer 3 joined to the Schottky electrode 69. Further, the $p^-$-type region 63*b* has a function of mitigating electric field applied to the $p^+$-type region 63*a*.

The $p^+$-type regions 64 are provided at predetermined intervals in the $n^-$-type epitaxial layer 33*a* in the active region A and configure the JBS structure (device structure portion) (portion indicated by a two-dot chain line). An impurity concentration of the $p^+$-type regions 64 may be equal to an impurity concentration of the $p^+$-type region 63*a*. The $p^-$-type region 65*a* and the $p^{--}$-type region 65*b* configure a double zone separation termination (separation termination extension (STE)) structure. The STE structure is a structure in which the termination structure is disposed apart from p-type regions (the $p^+$-type region 63*a* and the $p^-$-type region 63*b*) configuring an electric field mitigating structure. The double zone STE structure is a STE structure having a configuration in which two p-type regions (the $p^-$-type region 65*a* and the $p^{--}$-type region 65*b*) of differing impurity concentrations and configuring the termination structure are disposed in parallel so as to be in contact with each other.

An electrode pad 60 containing, for example, aluminum is provided on the Schottky electrode 69. The electrode pad 60 is provided spanning into the voltage withstanding structure portion B from the active region A. Ends of the electrode pad 60 may terminate on the Schottky electrode 69. On the STE structure, a protective film 61 such as a passivation film containing, for example, a polyimide is provided so as to cover ends of the Schottky electrode 69 and the electrode pad 60. The protective film 61 has a function of preventing discharge.

In the voltage withstanding structure portion B, an interlayer insulating film 66 is provided so as to cover surfaces of the $p^-$-type region 63*b*, a portion of the $n^-$-type drift layer 3 sandwiched between the $p^-$-type region 63*b* and the $p^-$-type region 65*a*, the $p^-$-type region 65*a*, the $p^{--}$-type region 65*b*, and a portion of the $p^+$-type region 63*a* facing the $p^-$-type region 63*b*. The interlayer insulating film 66 covering the STE structure electrically insulates the $p^-$-type region 65*a* and the $p^{--}$-type region 65*b* from the device structure portion of the active region A. At the front surface of the semiconductor substrate 62, the Schottky electrode 69 is provided via a contact hole that penetrates through the interlayer insulating film 66. The Schottky electrode 69 is provided spanning a portion of the voltage withstanding structure portion B from the active region A.

In particular, in the active region A, the Schottky electrode 69 covers the entire surface of the $n^-$-type epitaxial layer 33*a* exposed in the contact hole of the interlayer insulating film 66, and is in contact with a portion of the $p^+$-type region 63*a* provided in the active region A. Further, the Schottky electrode 69 is provided spanning into the voltage withstanding structure portion B from the active region A to overlap and be on the interlayer insulating film 66. Ends of the Schottky electrode 69, for example, terminate above the $p^+$-type region 63*a* (on a portion of the interlayer insulating film 66, covering the $p^+$-type region 63*a*). The Schottky electrode 69 forms a Schottky junction with the n-type drift layer 3 and configures an anode electrode.

In FIG. 6, the Schottky electrode 69 is provided to overlap and be on the interlayer insulating film 66 that covers the STE structure. FIG. 6 depicts an instance in which the ends of the Schottky electrode 69 terminate above the $p^-$-type region 65*a* configuring the STE structure (on the portion of the interlayer insulating film 66, covering the $p^-$-type region 65*a*).

The Schottky electrode 69 suffices to cover at least a portion of the $p^-$-type region 65*a* via the interlayer insulating film 66 and may cover the entire $p^-$-type region 65*a* via the interlayer insulating film 66. In other words, the ends of the Schottky electrode 69 may extend to a border between the $p^-$-type region 65*a* and the $p^{--}$-type region 65*b* (on a periphery the $p^-$-type region 65*a*) or may extend to an upper portion of the $p^{--}$-type region 65*b*. At the back surface (surface having the $n^+$-type starting substrate 31) of the semiconductor substrate 62, a cathode electrode 68 that forms an ohmic contact with the $n^+$-type starting substrate 31 (the $n^+$-type cathode region 67) is provided.

Next, an example of a MOSFET having a vertical planar gate structure is described with reference to FIG. 7. In the active region A, a MOS (insulated gate formed by a metal, an oxide film, and a semiconductor) structure (device structure portion) is formed in a front side of a semiconductor substrate (semiconductor chip) 70 that contains silicon carbide as a semiconductor material. In particular, the semiconductor substrate 70 is formed by sequentially forming, by epitaxial growth, the epitaxial layers 33*a*, 34 that constitute, respectively, the $n^-$-type drift layer 3 and a later-described second p-type base regions 73, on the $n^+$-type starting substrate 31 that constitutes the $n^+$-type drain region 1. In the active region A, $p^+$-type regions (first $p^+$-type base regions) 72 are selectively provided in a surface layer of the $n^-$-type epitaxial layer 33a, the surface layer being on a first side thereof (facing the front surface of the semiconductor substrate 70) opposite to a second side thereof facing the $n^+$-type starting substrate 31. The first $p^+$-type base regions 72 are doped with, for example, aluminum.

As described above, in the $n^-$-type epitaxial layer 33a (hatched portion), for example, an n-type impurity such as nitrogen or phosphorus is doped as an n-type dopant and a p-type impurity such as aluminum or boron, which are p-type impurities, is co-doped as a p-type dopant. A portion of the $n^-$-type epitaxial layer 33a excluding the first $p^+$-type base regions 72, the $p^-$-type region 63b, the $p^-$-type region 65a, and the $p^{--}$-type region 65b is the $n^-$-type drift layer 3 that functions as a drift region. The first $p^+$-type base regions 72, the $p^-$-type region 63b, the $p^-$-type region 65a, and the $p^{--}$-type region 65b are diffused regions formed in the surface layer of the $n^-$-type epitaxial layer 33a by ion implantation of a p-type impurity.

The p-type epitaxial layer 34 is selectively deposited on surfaces of the first $p^+$-type base regions 72 and a portion (the $n^-$-type drift layer 3) of the $n^-$-type epitaxial layer 33a that is sandwiched between the first $p^+$-type base regions 72 that are adjacent to each other. The p-type epitaxial layer 34 is deposited only in the active region A. An impurity concentration of the p-type epitaxial layer 34 is lower than an impurity concentration of the first $p^+$-type base regions 72. The p-type epitaxial layer 34 is doped with, for example, aluminum.

In portions of the p-type epitaxial layer 34 on the first $p^+$-type base regions 72, $n^+$-type source regions 74 and $p^{++}$-type contact regions 75 are each selectively provided. The $n^+$-type source regions 74 are in contact with the $p^{++}$-type contact regions 75. The $p^{++}$-type contact regions 75 are disposed closer to the voltage withstanding structure portion B than are the $n^+$-type source regions 74. Further, the $p^{++}$-type contact regions 75 penetrate through the p-type epitaxial layer 34 in the depth direction and reach the first $p^+$-type base regions 72.

In a portion of the p-type epitaxial layer 34 on the $n^-$-type drift layer 3, an n-type well region 76 that penetrates through the p-type epitaxial layer 34 in the depth direction and reaches the $n^-$-type drift layer 3 is provided. The n-type well region 76 functions as a drift region together with the $n^-$-type drift layer 3. Portions (hereinafter, second p-type base regions) 73 of the p-type epitaxial layer 34 excluding the $n^+$-type source regions 74, the $p^{++}$-type contact regions 75, and the n-type well region 76 function as base regions together with the first $p^+$-type base regions 72.

On surfaces of portions of the second p-type base regions 73 sandwiched between the n-type well region 76 and the $n^+$-type source regions 74, a gate electrode 78 is provided via a gate insulating film 77. The gate electrode 78 may be provided on the surface of the n-type well region 76, via the gate insulating film 77. An interlayer insulating film 80 is provided on the entire front surface of the semiconductor substrate 70 so as to cover the gate electrode 78. A source electrode 79 is in contact with the $n^+$-type source regions 74 and the $p^{++}$-type contact regions 75 via contact holes that penetrate through the interlayer insulating film 80, the source electrode 79 forming an ohmic contact with the semiconductor substrate 70.

Further, the source electrode 79 is electrically insulated from the gate electrode 78 by the interlayer insulating film 80. Ends of the source electrode 79 extend onto the interlayer insulating film 80 and terminate above the first $p^+$-type base regions 72 (on portions of the interlayer insulating film 80 covering the first $p^+$-type base regions 72). An electrode pad 81 is provided on the source electrode 79. Ends of the electrode pad 81 terminate on the source electrode 79. On the voltage withstanding structure portion B, a protective film 82 such as a passivation film containing, for example, a polyimide is provided so as to cover respective ends of the source electrode 79 and the electrode pad 81. The protective film 82 has a function of preventing discharge.

In the voltage withstanding structure portion B, the $p^-$-type region 63b that is in contact with the first $p^+$-type base regions 72 and surrounds a periphery of the first $p^+$-type base regions 72 is provided closer to the chip end than are the first $p^+$-type base regions 72. The $p^-$-type region 65a and the $p^{--}$-type region 65b are provided closer to the chip end than are the $p^-$-type region 63b, similarly to FIG. 6. In other words, in the voltage withstanding structure portion B, the first $p^+$-type base regions 72, the $p^-$-type region 63b, a portion of the $n^-$-type drift layer 3, the $p^-$-type region 65a, and the $p^{--}$-type region 65b are disposed sequentially in parallel, in a direction from the active region A to the chip end.

As described above, according to the embodiments, the $n^-$-type drift layer is a $n^-$-type epitaxial layer doped with nitrogen and co-doped with aluminum, and the total impurity concentration of nitrogen and aluminum is set to be at least $3\times10^{16}/cm^3$. As a result, the effect of intervalley scattering on temperature dependence of electron mobility at high temperatures may be reduced and decreases in electron mobility may be suppressed. Thus, the impurity concentration obtained by subtracting the aluminum concentration from the nitrogen concentration of the $n^-$-type drift layer is set as an n-type impurity concentration that realizes a predetermined blocking voltage, whereby a blocking voltage about the same as that of a conventional structure is maintained, on-resistance at high temperatures and conduction loss can be reduced.

In the foregoing, the present invention is not limited to the embodiments described above and various modifications not departing from the spirit of the invention are possible.

As described above, according to the present invention, a predetermined blocking voltage may be realized by the n-type impurity concentration obtained by subtracting a second impurity concentration from a first impurity concentration of a drift layer. Further, the effect of intervalley scattering on temperature dependence of electron mobility at high temperature may be reduced by the total impurity concentration of the first impurity concentration and the second impurity concentration of the drift layer and decreases in electron mobility may be suppressed.

The silicon carbide semiconductor device according to the present invention achieves an effect in that the blocking voltage may be maintained, on-resistance at high temperatures may be reduced, and conduction loss may be reduced.

As described above, the silicon carbide semiconductor device according to the present invention is useful for power semiconductor devices used in power converting equipment, power source devices of various types of industrial machines, etc. and is particularly suitable for MOSFETs used in inverter circuits.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:

a semiconductor substrate containing a semiconductor having a bandgap that is wider than a bandgap of silicon; and a device structure that is provided in the semiconductor substrate and has a predetermined blocking voltage, the device structure including a drift layer, wherein the drift layer is co-doped with both a first impurity of an n-type and a second impurity of a p-type, with a concentration of the first impurity higher than a concentration of the second impurity, to thereby result in an overall impurity of the n-type, and the drift layer is so doped that when the predetermined blocking voltage is a first blocking voltage class, an n-type impurity concentration is in a range is $1\times10^{16}/cm^3\pm20\%$, and a combined impurity concentration is in a range is $3\times10^{16}/cm^3$ to $1.3\times10^{17}/cm^3$, when the predetermined blocking voltage is a second blocking voltage class, the n-type impurity concentration is in a range is $3\times10^{15}/cm^3\pm20\%$, and the combined impurity concentration is in a range is $3\times10^{16}/cm^3$ to $1.1\times10^{17}/cm^3$, and when the predetermined blocking voltage is a third blocking voltage class, the n-type impurity concentration is in a range is $1\times10^{15}/cm^3\pm20\%$, and the combined impurity concentration is in a range is $3\times10^{16}/cm^3$ to $9\times10^{16}/cm^3$, wherein the n-type impurity concentration is calculated by subtracting the concentration of the second impurity from the concentration of the first impurity, and the combined impurity concentration is calculated by adding the concentration of the second impurity to the concentration of the first impurity.

2. The silicon carbide semiconductor device according to claim 1, wherein the device structure is an insulated gate electric field effect transistor having a trench gate structure.

3. The silicon carbide semiconductor device according to claim 1, wherein the device structure is an insulated gate electric field effect transistor having a planar gate structure.

4. The silicon carbide semiconductor device according to claim 1, wherein the device structure is a Schottky barrier diode.

5. The silicon carbide semiconductor device according to claim 1, wherein the drift layer is an epitaxial layer uniformly doped throughout with the first impurity and the second impurity.

6. The silicon carbide semiconductor device according to claim 1, wherein the first impurity is nitrogen, and the second impurity is aluminum or boron.

7. The silicon carbide semiconductor device according to claim 1, wherein the semiconductor substrate contains silicon carbide.

8. A silicon carbide semiconductor device, comprising:

a semiconductor substrate containing a semiconductor having a bandgap that is wider than a bandgap of silicon; and a device structure that is provided in the semiconductor substrate and has a predetermined blocking voltage, the device structure including a drift layer that is of an n-type, wherein the drift layer contains a first impurity of the n-type and a second impurity of a p-type, the predetermined blocking voltage is ensured by an n-type impurity concentration determined by subtracting a concentration of the second impurity from a concentration of the first impurity of the drift layer, the n-type impurity concentration being within a first range, a combined impurity concentration of the concentration of the first impurity and the concentration of the second impurity of the drift layer is in a second range, when the predetermined blocking voltage is a first blocking voltage class, the first range is $1\times10^{16}/cm^3\pm20\%$ and the second range is $3\times10^{16}/cm^3$ to $1.3\times10^{17}/cm^3$, when the predetermined blocking voltage is a second blocking voltage class, the first range is $3\times10^{15}/cm^3\pm20\%$ and the second range is $3\times10^{16}/cm^3$ to $1.1\times10^{17}/cm^3$, when the predetermined blocking voltage is a third blocking voltage class, the first range is $1\times10^{15}/cm^3\pm20\%$ and the second range is $3\times10^{16}/cm^3$ to $9\times10^{16}/cm^3$, the first blocking voltage class is 1.2 kV-class, the second blocking voltage class is 3.3 kV-class, and the third blocking voltage class is 6.5 kV-class.

* * * * *